United States Patent [19]

Göckler

[11] Patent Number: 4,725,972
[45] Date of Patent: Feb. 16, 1988

[54] METHOD AND APPARATUS FOR THE TRANSMISSION OF TIME DISCRETE SIGNALS BETWEEN SYSTEMS OPERATING AT DIFFERENT SAMPLING RATES

[75] Inventor: Heinz Göckler, Backnang, Fed. Rep. of Germany

[73] Assignee: ANT Nachrichtentechnik GmbH, Backnang, Fed. Rep. of Germany

[21] Appl. No.: 632,857

[22] Filed: Jul. 16, 1984

[30] Foreign Application Priority Data

Jul. 14, 1983 [DE] Fed. Rep. of Germany ..... 83106915

[51] Int. Cl.$^4$ ............................................. G06F 15/31
[52] U.S. Cl. ..................................................... 364/724
[58] Field of Search ........................................... 364/724

[56] References Cited

U.S. PATENT DOCUMENTS

| | | | |
|---|---|---|---|
| 4,375,081 | 2/1983 | Blesser | 364/724 |
| 4,539,694 | 9/1985 | Wattenhofer | 364/719 |
| 4,567,464 | 1/1986 | Siegal et al. | 340/347 DD |
| 4,569,075 | 2/1986 | Nussbaumer | 381/34 |
| 4,612,625 | 9/1986 | Betrand | 364/724 |
| 4,623,980 | 11/1986 | Vary | 364/724 |

OTHER PUBLICATIONS

Bellanger et al., "Digital Filtering by Polyphase Network: Application to Sample-Rate Alteration and Filter Banks", *IEEE Trans. on Acoustics, Speech, and Signal Processing*, vol. ASSP-24, No. 2, pp. 109-114, Apr. 1976.
Glocker, "A Unified State-Space Representation of Digital Multirate Filters", *Signal Processing II: Theories and Applications*, 9/12/83, pp. 61-67.
S. A. Tretter, "Introduction to Discrete Time Signal Processing", pp. 128-137.
Ansari et al., "Interpolators and Decimators as Periodically Time-Varying Filters", 1981, IEEE International Symposium on Circuits and System Proceedings, vol. 2, pp. 447-450.
Roger Lagadec et al., "A 2-Channel, 16-Bit Digital Sampling . . . ", ICA-SSP-82, Paris, pp. 93-96.
Ronald E. Crochiere, "Interpolation and Decimation of Digital Signals-A Tutorial Review", IEEE Proceedings, vol. 69, No. 3, Mar. 1981, pp. 300-331.
Texas Instruments Bulletin No. DL-S 7611804, Dec. 1972, Revised Oct. 1976, "Types SN54LS138, SN54LS139 . . . Decoders/Demultiplexers", pp. 7-13-4-135.
Texas Instruments Bulletin DLS 7611834, Dec. 1972—Rev. Oct. 1976, "Types SN54251, SN54251 . . . Data Selectors/Multiplexers with 3-State Outputs", pp. 7-362-365.
Texas Instrument Bulletin, DL-S 7611853, Mar. 1974-Rev. Oct. 1976, "Types SN5483A, SN54LS83A, . . . 4-Bit Binary Full Addrs with Fast Carry", pp. 7-5-3-7-55.
A. G. Constantinides et al., "A Class of Efficient Interpolators and Decimators with Applications in Transmultiplexing", IEEE International Symposium on Circuits and Systems, vol. 2, 1982, pp. 260-263.

*Primary Examiner*—Gary V. Harkcom
*Assistant Examiner*—Dale M. Shaw
*Attorney, Agent, or Firm*—Spencer & Frank

[57] ABSTRACT

A method and apparatus for the transmission of time discrete signals between source and sink systems wherein a first signal x(n) is generated by the source system at a first sampling rate $f_i$ and a second time discrete signal y(m) is generated by a sink system at a second sampling rate $f_0$. The method is carried out by cyclically distributing the first time discrete signal to each of L filter groups at the first sampling rate $f_i$. Each of the L filter groups comprises M filter elements which have their inputs connected to a common terminal and have the transfer function $H_{l,m}(z^{LM}$, where L and M are integers, l is an integer 0, 1 . . . L−1 corresponding to the filter group in which the filter element is located and m is an integer 0, 1 . . . M−1 corresponding to the location of the filter element in its associated filter group. The first time discrete signal is filtered in each of the filter elements at a processing rate $f_i/L$ and the filtered signals stored in the filter elements. Thereafter, the stored outputs of the M filter elements in each of the L filter groups are cyclically sampled at the second sampling rate $f_0$ and coupled to corresponding inputs of a summing element which generates a signal $f_0$ at its output equal to M/L $f_i$.

13 Claims, 5 Drawing Figures

METHOD AND APPARATUS FOR THE TRANSMISSION OF TIME DISCRETE SIGNALS BETWEEN SYSTEMS OPERATING AT DIFFERENT SAMPLING RATES

BACKGROUND OF THE INVENTION

The present invention relates to a method and apparatus for the transmission of time discrete signals between two systems operating at different sampling rates. Stated another way, it relates to a method and apparatus whereby a signal sampled at a first sampling rate is converted to a signal sampled at a second sampling rate, and wherein the conversion is effected at a signal processing rate that is not higher than the higher of the two sampling rates.

A known digital sampling frequency converter is disclosed in an article "A Two-channel 16-bit Digital Sampling Frequency Converter for Professional Digital Audio," Lagadec et al, ICASSP-82 (International Conference on Acoustics, Speech and Signal Processing), Paris, Pages 93–96. In the converter described in this article, the sampling rate is increased $2^{15}$ times and then reduced, resulting in a disadvantageously high processing rate.

It is an object of the present invention to overcome this drawback of the prior art system by providing a method and apparatus for converting from one sampling rate to another sampling rate at a signal processing rate which is not higher than the higher of the two sampling rates.

Another object is to provide an apparatus which can be used at any desired ratio of sampling rates.

Still another object is to provide a system which is simple, employs a relatively low signal processing rate and can be used at any desired sampling rate ratio.

SUMMARY OF THE INVENTION

The present invention provides a method and apparatus for the transmission of time discrete signals between source and sink systems wherein a first signal $x(n)$ is generated by the source system at a first sampling rate $f_i$ from which signal a second time discrete signal $y(m)$ is derived and fed to a sink system at a second sampling rate $f_0$. The method is carried out by cyclically distributing the first time discrete signal to each of L filter groups at the first sampling rate $f_i$. Each of the L filter groups comprises M filter elements which have their inputs connected to a common terminal and have the transfer function $H_{l,m}(z^{LM})$, where L and M are integers, l is an integer $0, 1 \ldots L-1$ corresponding to the filter group in which the filter element is located and m is an integer $0, 1 \ldots M-1$ corresponding to the location of the filter element in its associated filter group. The first time discrete signal is filtered in each of the filter elements as a processing rate $f_i/L$ and the filtered signals stored in the filter elements. Thereafter, the stored outputs of the M filter elements in each of the L filter groups are cyclically sampled at the second sampling rate $f_0$ and coupled to corresponding inputs of a summing element which generates a signal $y(m)$ at its output at the sampling rate $f_0$ equal to $M/L\ f_i$.

DESCRIPTION OF A PREFERRED EMBODIMENT

Figure 1:
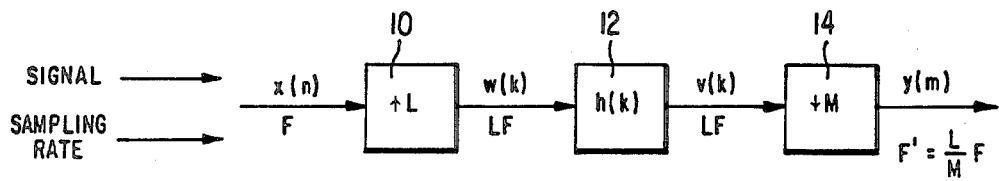
FIG. 1 is a prior art cascade apparatus for converting the sampling rate of an input signal to a different sampling rate by the use of an integer interpolator and an integer decimator.

FIG. 1 illustrates a prior art apparatus, disclosed in an article "Interpolation and Decimation of Digital Signals—A Tutorial Review", Crochiere et al, Proceedings of the IEEE, Volume 69, No. 3, March 1981, pages 300–331, for digitally converting an input signal $x(n)$ sampled at a first rate F to an output signal $y(m)$ having a sampling rate F'. The sampling rate of the signal $x(n)$ is increased by the factor L in a sampling rate expander 10 to produce a signal $w(k)$, where L is an integer. The output of expander 10 is applied to a low pass filter 12 having an impulse response $h(k)$ which operates at the sampling rate LF. The output of the filter 12, $v(k)$, is applied to a sampling rate compressor 14 which decreases the sampling rate of the signal $v(k)$ by the factor M, where M is an integer, to produce the signal $y(m)$ having a sampling rate $F' = L/M\ F$.

As discussed at page 306 of the Crochiere article, the sampling rate conversion system of FIG. 1 increases the signal sampling rate by a factor of L (by filling in L-1 zero-valued samples between each sample of $x(n)$ to give the signal $w(k)$), filters $w(k)$ by a standard linear time-invariant low-pass filter 12 to give $v(k)$, and compresses $v(k)$ sampling rate by a factor M by retaining one of each M sample of $v(k)$. A direct implementation of this system is inefficient because the low-pass filter 12 operates at the high sampling rate on a signal for which L-1 out of each L input values are zero, and the values of the filtered output are required only once for each M samples.

Figure 2A:
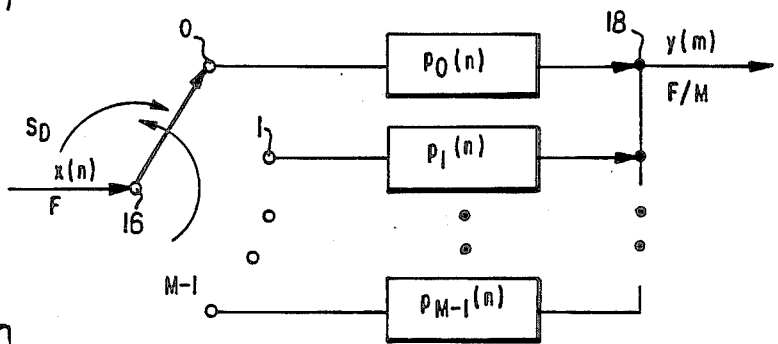
FIGS. 2a and 2b are respectively prior art polyphase commutator interpolator and decimator devices which may be used in the apparatus of FIG. 1.

The signal rate expander 10 (which performs the process of interpolation) and the signal rate compressor 14 (which performs the process of decimation) can be realized by polyphase finite impulse response (FIR) or recursive structures, respectively. FIG. 2a shows a known polyphase integer decimator employing a commutator $S_D$ wherein an input signal $x(n)$ is distributed at a sampling rate F to M filters having the impulse response $p_i(n)$, where $i = 0, 1 \ldots M-1$. Commutator $S_D$, which rotates in the counterclockwise direction, is provided with a common terminal 16 to which the signal $x(n)$ is connected, and m terminals 0 to M-1, each of which is connected to one end of a corresponding polyphase filter $p_0(n), p_1(n) \ldots p_{M-1}(n)$. The other ends of the polyphase filters are commonly connected to an adder 18 to produce the signal $y(m)$ having the reduced sampling rate F/M.

Figure 2B:
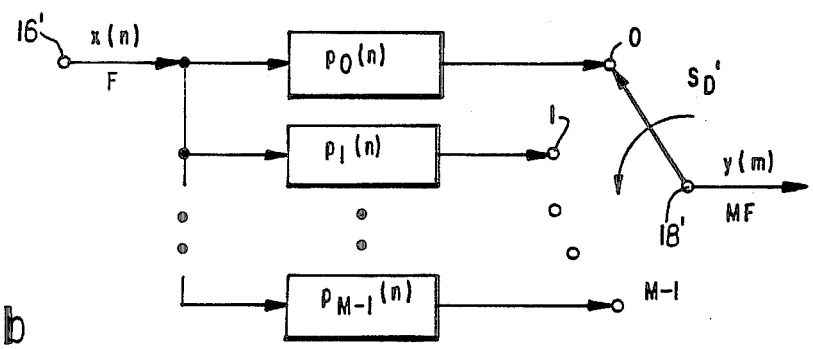

The decimator of FIG. 2a can be transposed into the sampling rate interpolator shown in FIG. 2b by inverting all of the directional arrows and replacing all summing points by branching points. That is, a signal $x(n)$ having a sampling rate F is applied simultaneously via terminal 16' to all of the inputs of filters $p_i(n)$ and then cyclically sampled at the rate M by the switch $S_D$ rotating in the counterclockwise direction. This produces a signal y(m) at the output terminal 18' at the increased sampling rate MF.

The present invention is based on the realization that the individual filters $p_i(n)$ in the decimator of FIG. 2a can be replaced by a decimator operating in a transposed mode, that is, as a sampling rate interpolator, thereby providing for conversion of the sampling rate at the ratio M/L. This substitution makes it possible to perform simultaneously all filter operations at the lowest possible sampling rate, namely $f_i/L = f_0/M$, where $f_i$ is the rate at which the input signal x(n) is sampled and $f_0$ is the rate at which the output signal y(m) is sampled.

Figure 3:
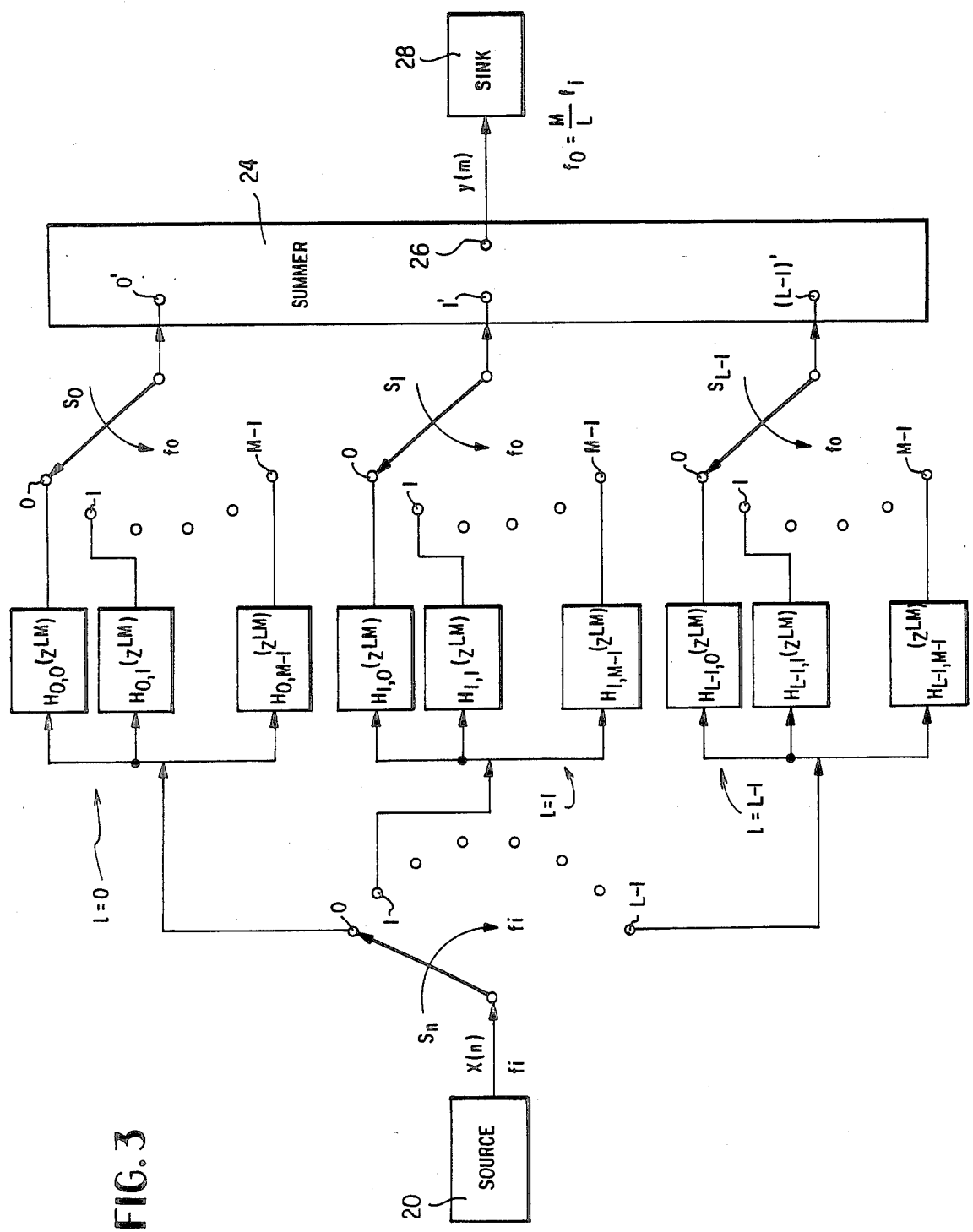
FIG. 3 is a schematic diagram of the present invention for transmitting time discrete signals between systems having different sampling rates.

Referring to FIG. 3, the input signal x(n) at the output of a source system 20, sampled at a rate $f_i$, is coupled to the common terminal 22 of a distributor multiplexer $S_n$ which rotates in the clockwise direction and has terminals $l=0, 1, 2, \ldots (L-1)$. Distributor multiplexer $S_n$ may be realized in a practical embodiment of the invention by SN 74 LS 138 produced by Texas Instruments for L=8, for instance.

L filter groups have their inputs connected respectively to terminals $l=0, 1 \ldots L-1$ of distributor multiplexer $S_n$. Each of the L filter groups consists of M filter elements, and each of the M filter elements has the transfer function $H_{l,m}(z^{LM})$, where l is an integer $0, 1 \ldots L-1$ corresponding to the filter group in which the filter element is located and m is an integer $0, 1 \ldots M-1$ corresponding to the location of the filter in its associated filter group.

More specifically, the filter group $l=0$ comprises M filter elements having the transfer functions $H_{0,0}(z^{LM})$, $H_{0,1}(z^{LM}) \ldots H_{0,M-1}(z^{LM})$, the M filter elements in filter group $l=1$ have the transfer functions $H_{1,0}(z^{LM})$, $H_{1,1}(z^{LM}) \ldots H_{1,M-1}(z^{LM})$ and the M filter elements in the L-1st filter group $l=L-1$ have the transfer functions $H_{L-1,0}(z^{LM}), H_{L-1,1}(z^{LM}) \ldots H_{L-1,M-1}(z^{LM})$.

Sampling multiplexers $S_0, S_1 \ldots S_{L-1}$, which are arranged to rotate in the counterclockwise direction, couple the outputs of the M filter elements in each of filter groups $l=0, 1 \ldots L-1$ respectively to terminals $0', 1' \ldots (L-1)'$ of a summing device 24. The signal y(m) at the output terminal 26 has the sampling rate $f_0 = M/F \, f_i$, and is provided to the sink system 28. Multiplexers $S_0, S_1 \ldots S_{L-1}$ and summer 24 are commercially available as SN 74 LS 25A for multiplexing of M=8 signals, and as SN 74 LS 83A for the binary summation of 4 bits, for example, both manufactured by Texas Instruments.

Figure 4:
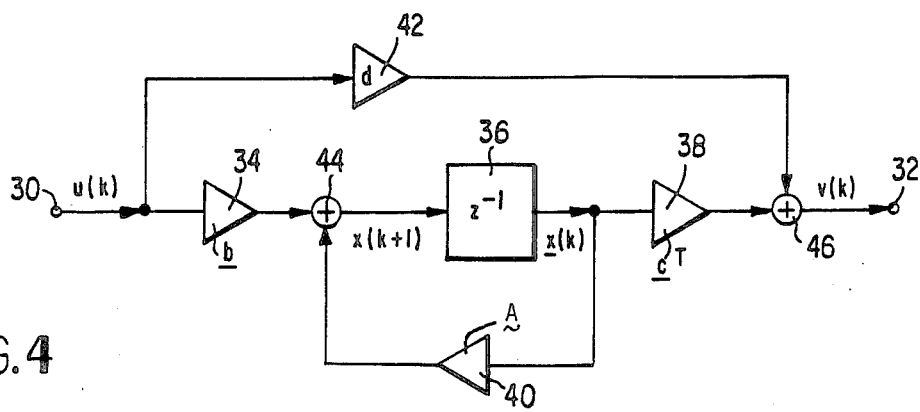
FIG. 4 is a block diagram of a filter element used in the apparatus of FIG. 3.

The filter elements used in the apparatus of FIG. 3 can be realized by the state-space filter structure shown in the block diagram of FIG. 4 although other equivalent filter structures may also be used. In this circuit, an input terminal 30 is connected to one of the terminals 0, 1 ... L−1 of the distributor multiplexer $S_n$ and the output terminal 32 to one of the terminals $0, 1 \ldots M-1$ of one of the switches $S_0, S_1 \ldots S_{L-1}$. An vector multiplier 34 having the transfer function b has its single input coupled to terminal 30 and its outputs to terminal 32 through a vector adder 44 and a matrix delay element 36, having a matrix transfer function $z^{-1}$, and a device 38 for producing the scalar product of its elements together with its input vector having a transfer function $c^T$ and an adder 46 for two signals. A feedback matrix multiplier 40 having a matrix transfer function A has its inputs coupled to the outputs of the matrix delay element 36 and and its vector output coupled to the second vector input of the vector adder 44, and a scalar multiplier 42 with a transfer function d is coupled between the input 30 and the second input terminal of adder 46.

The symbols $\underline{A}$, $\underline{b}$, $\underline{c}^T$, $\underline{z}^{-1}$, $\underline{x}(k)$ and d have the following definitions:

$\underline{A}$ is a square matrix with N rows and N columns, where N is the degree of the transfer function of the filter of FIG. 4

$$\underline{A} = \begin{pmatrix} a_{11}, a_{12} \ldots a_{1N} \\ a_{21} \cdot \quad \quad \cdot \\ \cdot \quad \quad \cdot \quad \cdot \\ \cdot \quad \quad \quad \cdot \\ a_{N1} \cdot \quad \ldots a_{NN} \end{pmatrix}$$

$\underline{b}$ is the N-dimensional input vector of the structure FIG. 4 (a column vector)

$$\underline{b} = \begin{pmatrix} b_1 \\ b_2 \\ \cdot \\ \cdot \\ \cdot \\ b_N \end{pmatrix}$$

$\underline{c}^T$ is the N-dimensional filter output vector, where the superscript denotes transposition (a row vector)

$$\underline{c}^T = (c_1, c_2 \ldots c_N)$$

$\underline{z}^{-1}$ and $\underline{z}$ respectively, are diagonal matrices $$\underline{z} = \begin{pmatrix} \overset{v}{z} & & & \\ & \overset{v}{z} & \sigma & \\ & & \cdot & \\ & \sigma & & \overset{v}{z} \end{pmatrix} \quad \text{and} \quad \underline{z}^{-1} = \begin{pmatrix} \overset{v-1}{z} & & & \\ & \overset{v-1}{z} & \sigma & \\ & & \cdot & \\ & \sigma & & \overset{v-1}{z} \end{pmatrix}$$

which represent all delay functions inherent to the filter of FIG. 4, where $$\overset{v}{z} = z^{LM}.$$

$\underline{x}(k)$ is the N-dimensional state-vector which represents the state of the filter at the time instant k (a column vector), and d is a scalar factor. According, for instance, to the standard textbook S. A. Tretter, "Introduction of discrete-time signal processing", John Wiley+Sons, New York, 1976, pp. 128–137, the operation of the filter of FIG. 4 can completely be described by means of the state-equations for filters with one input and one output $$\underline{x}(k+1) = \underline{A}\underline{x}(k) + \underline{b}u(k)$$

$$v(k) = \underline{c}^T\underline{x}(k) + du(k)$$

Thus, the actual output signal of the filter of FIG. 4 can be calculated according to the standard rules of vector algebra, which are depicted in FIG. 4: The new state at instant k+1 is given by the sum of matrix $\underline{A}$ multiplied from the right hand side by the state vector of instant k and the product of the input vector $\underline{b}$ times the value of the input signal at instant k. Then, the output signal at instant k is given by the sum of the scalar product $$\underline{c}^T\underline{x}(k) = c_1x_1(k) + c_2x_2(k) + \ldots + c_Nx_N(k)$$

of the output vector and the filter state of instant k and the product of the scalar (one-dimensional) value d with the input signal at time instant k. From this the transfer function of the filter of FIG. 4 can be derived according to Tretter as mentioned above as follows:

$$H(z) = \underline{c}^T(\underline{z}-\underline{A})^{-1}\underline{b} + d$$

Since the filter of FIG. 4 actually operates at the rate $f_i/L = f_0/M$, the argument of H(z) has to be replaced by $z^{LM}$, as it is already shown in the definiton of the matrices $\underline{z}^{-1}$ and $\underline{z}$, respectively. Furthermore, since $H(z^{LM})$ is only a subfilter of FIG. 3, the number of the filter group 1 and the number of the filter within the filter group has to be indicated by indices, yielding $$H_{l,m}(z^{LM}) = \underline{c}^T_{l,m}(\underline{z}-\underline{A})^{-1}\underline{b}_{l,m} + \underline{d}_{l,m}$$

The detailed operation of the circuit of FIG. 3 will now be explained.

As an arbitrary starting position of the various multiplexers we define all switches to be in l=0 and m=0 position. Then the sample of the source signal x(n) is fed to all branch filters of the group l=0, from which the filter $H_{0,0}(z^{LM})$ provides the summer via multiplexer switch $S_o$ with a contribution to the output signal y(m). The other multiplexer switches $S_1, S_2, \ldots, S_{L-1}$ may provide additional contributions to y(m) via the summer 24, which stem from earlier inputs to the filter groups $l=1, 2, \ldots L-1$. The key for the understanding of the operation of FIG. 3 is that the input multiplexer $S_n$ switches from one to the adjacent position every $T_i = 1/f_i$ seconds, whereas the output multiplexers $S_o, S_1, \ldots, S_{L-1}$ change to the adjacent positions every $T_o = 1/f_o$ seconds. For any position of every switch the same operations have to be carried out as it was described for the l=0 and m=0 position.

In contrast to the state of the art (FIGS. 1+2), the invention according to FIG. 3 comprises a greater number of parallel branches (higher degree of parallelism), where on the other hand the branches according to the invention can operate at a lower rate.

The system for sample rate alteration can be operated in two fundamentally different modes:

(a) the synchronous mode:

This means that the input and output sampling rate $f_i$ and $f_o$, respectively, are derived from a common clock generator providing a frequency of $F = L \cdot f_o = M f_i$ (b) the asynchronous mode:

The source and sink systems are totally independent systems with autonomous clocks of their own. Each system has a nominal clock frequency $f_i$ and $f_o$, respectively, and a maximum possible deviation of its clock frequency $\pm \Delta f_i$ and $\pm \Delta f_o$, respectively. In this case, the input multiplexer $S_n$ may be synchronized by the instantaneous sampling rate $f_i$ of the source system $f_i - \Delta f_i \leq \bar{f}_i \leq f_i + \Delta f_i$ or by the nominal sampling rate of the source system, which is equal to the arithmetic mean of the input sampling rate $$\bar{f}_i = \frac{f_i - \Delta f_i + f_i + \Delta f}{2} = f_i$$

On the other hand, the output multiplexers may be synchronized by the sink system in the same manner as it was explained for the input synchronization.

Thus, it can be seen that the present invention is advantageous in that better parallelization is obtained and the operating rate reduced, with no higher sampling rates than $f_i/L = f_0/M$ occurring with any selected values of L and M. When it is desired to increase the sampling rates, it is only necessary to add additional filter groups and filter elements corresponding to the values of L and M. Also, as has been shown, the systems coupled by the circuit of FIG. 3 may be operated asynchronously or synchronously; that is, $f_0/f_i$ may be approximately equal to M/L.

It will be understood that the above description of the present invention is susceptible to various modifications, changes and adaptations, and the same are intended to be comprehended within the meaning and range of equivalents of the appended claims.

What is claimed is:

1. A method of transmitting first and second time discrete signals between source and sink systems wherein a first signal x(n) is generated by said source system at a first sampling rate $f_i$ and a second time discrete signal y(m) is generated by said sink system at a second sampling rate $f_0$ different from said first sampling rate $f_i$, comprising the steps of:

cyclically distributing said first time discrete signal x(n) to each of L filter groups at said first sampling rate $f_i$, each of said L filter groups comprising M filter elements having their inputs connected to a common terminal and having the transfer function $H_{l,m}(z^{LM})$, where L and M are integers, l is an integer 0, 1 . . . L−1 corresponding to the filter group in which the filter element is located and m is an integer 0, 1 . . . M−1 corresponding to the location of the filter element in its associated filter group;

filtering said first time discrete signal in each of said filter elements at a processing rate $f_i/L$;

holding the filtered signal in each of said filter elements;

cyclically sampling at said second sampling rate $f_0$, in each of said filter groups, the outputs of the M filter elements in each respective filter group to generate L filter group outputs; and summing said L filter group outputs to generate said second time discrete signal y(m) having a sampling rate $f_0 = M/L \; f_i$.

2. The method defined by claim 1 wherein said first and second sampling rates each have a tolerance range, and wherein the arithmetic means $\bar{f}_i, \bar{f}_0$ of each tolerance range is determined and L and M are selected such that $\bar{f}_i \cdot M = \bar{f}_0 \cdot L$.

3. The method defined by claim 2 wherein said source and sink systems are asynchronous.

4. The method defined by claim 2 wherein said source and sink systems are operated in synchronism.

5. The method defined by claim 2 wherein the arithmetic center frequencies of each tolerance range have a ratio with respect to each other which is not an integer.

6. The method defined by claim 5 wherein said source and sink systems are asynchronous.

7. The method defined by claim 1 wherein said first and second sampling rates each have a tolerance range, and wherein the arithmetic center frequencies of each tolerance range have a ratio with respect to each other which is not an integer.

8. The method defined by claim 7 wherein said source and sink systems are asynchronous.

9. The method defined by claim 7 wherein said source and sink systems are operated in synchronism.

10. The method defined by claim 1 wherein said source and sink systems are asynchronous.

11. The method defined by claim 1 wherein said source and sink systems are operated in synchronism.

12. The method defined by claim 1 wherein said time discrete signals are digital signals.

13. Apparatus for transmitting first and second time discrete signals between source and sink systems wherein a first signal x(n) is generated by said source system at a first sampling rate $f_i$ and a second time discrete signal y(m) is generated by said sink system at a second sampling rate $f_0$ which is different from the first sampling rate $f_i$, comprising:

L filter groups, each of said L filter groups including M filter elements having the transfer function $H_{l,m}(z^{LM})$, where L and M are integers, l is an integer 0, 1, ... L−1 corresponding to the filter group in which the filter element is located and m is an integer 0, 1, ... M−1 corresponding to the location of the filter element in its associated filter group, the inputs of the filter elements of each filter group being connected together to a common terminal;

a first multiplexer switch for cyclically distributing said first time discrete signal x(n) to the common terminals of each of said L filter groups at said first sampling rate $f_i$, each of said M filter elements filtering said first time discrete signal at a processing rate $f_i/L$ and holding the filtered signal;

a summing element having L inputs and an output; and a plurality of L second multiplexer switches, each of said second multiplexer switches cyclically sampling the outputs of the M filter elements in a respective one of said L filter groups at said second sampling rate $f_0$ and coupling said outputs to a corresponding input of said summing element, said second time discrete signal y(m) having a sampling rate $f_0 = M/L\, f_i$ being generated at the output of said summing element.

* * * * *